US008853543B2

(12) United States Patent
Liu

(10) Patent No.: US 8,853,543 B2
(45) Date of Patent: Oct. 7, 2014

(54) FIXING DEVICE FOR CIRCUIT BOARD AND ELECTRONIC APPARATUS HAVING THE SAME

(75) Inventor: Chia-Hsin Liu, New Taipei (TW)

(73) Assignee: Wistron Corporation (TW)

( * ) Notice: Subject to any disclaimer, the term of this patent is extended or adjusted under 35 U.S.C. 154(b) by 245 days.

(21) Appl. No.: 13/457,205

(22) Filed: Apr. 26, 2012

(65) Prior Publication Data

US 2012/0275127 A1 Nov. 1, 2012

(30) Foreign Application Priority Data

Apr. 27, 2011 (TW) .............................. 100114648 A

(51) Int. Cl.
*H05K 7/12* (2006.01)
*H05K 7/14* (2006.01)

(52) U.S. Cl.
CPC .................................. *H05K 7/1418* (2013.01)
USPC ....... 174/138 G; 361/801; 361/759; 361/807; 248/309.1; 439/377

(58) Field of Classification Search
USPC .......... 174/50, 520, 79, 138 G; 361/672, 673, 361/736, 740, 747, 748, 752, 759, 760, 756, 361/796, 801, 807; 248/309.1; 439/377, 439/374
See application file for complete search history.

(56) References Cited

U.S. PATENT DOCUMENTS 5,383,793 A * 1/1995 Hsu et al. ...................... 361/801
5,457,608 A * 10/1995 Scholder et al. .............. 361/759
5,754,406 A * 5/1998 Hardt et al. .................... 361/759
5,996,962 A * 12/1999 Chang et al. .................. 361/759
6,021,049 A * 2/2000 Thompson et al. ........... 361/801
6,752,276 B2 * 6/2004 Rumney ........................ 361/801
6,885,565 B2 * 4/2005 Shi ................................ 361/801
7,149,094 B2 * 12/2006 Li .................................. 361/801
7,278,872 B2 * 10/2007 Brown et al. ................. 361/801
8,553,424 B2 * 10/2013 Chiang ......................... 361/801

FOREIGN PATENT DOCUMENTS

TW          580238     3/2004
TW          M277850    10/2005

OTHER PUBLICATIONS

Office Action dated Oct. 28, 2013 issued in Taiwanese Patent Application No. 100114648 with English language translation of sections boxed in red, 12 pages.
Taiwan Office Action dated Aug. 27, 2013 issued in TW Patent Application No. 100114648, 8 pages. Abridged English language translation provided.

* cited by examiner

*Primary Examiner* — Angel R Estrada
(74) *Attorney, Agent, or Firm* — Grossman Tucker Perreault & Pfleger

(57) ABSTRACT

A fixing device includes a casing defining a receiving space and having an open end, and a movable element having a protruding end protruding from the open end. The movable element is movable relative to the casing along a first direction to vary a protruding distance of the protruding end from the open end of the casing. A plurality of first positioning portions are provided on one of the casing and the movable element. The second positioning portion engages interferentially and releasably a selected one of the first positioning portions along a second direction that is perpendicular to the first direction to restrict movement of the movable element relative to the casing.

26 Claims, 9 Drawing Sheets

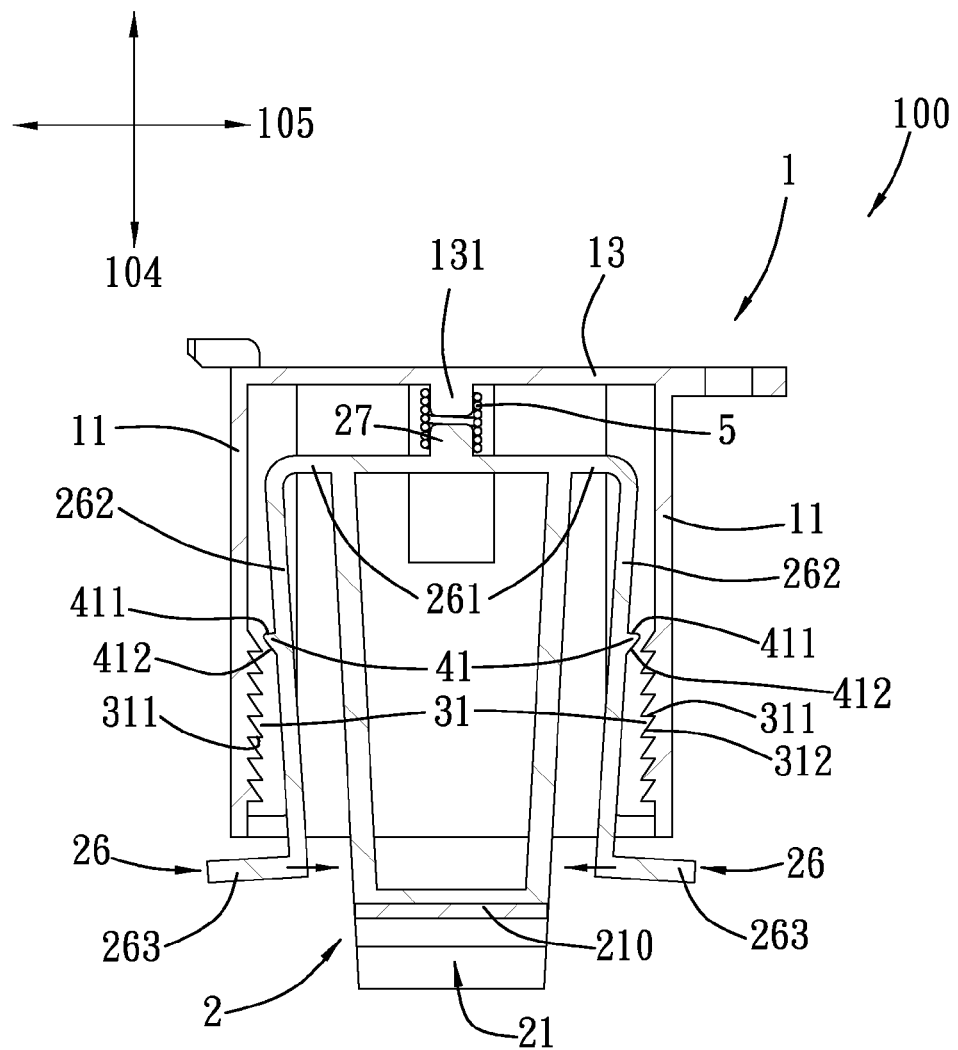
F I G. 6

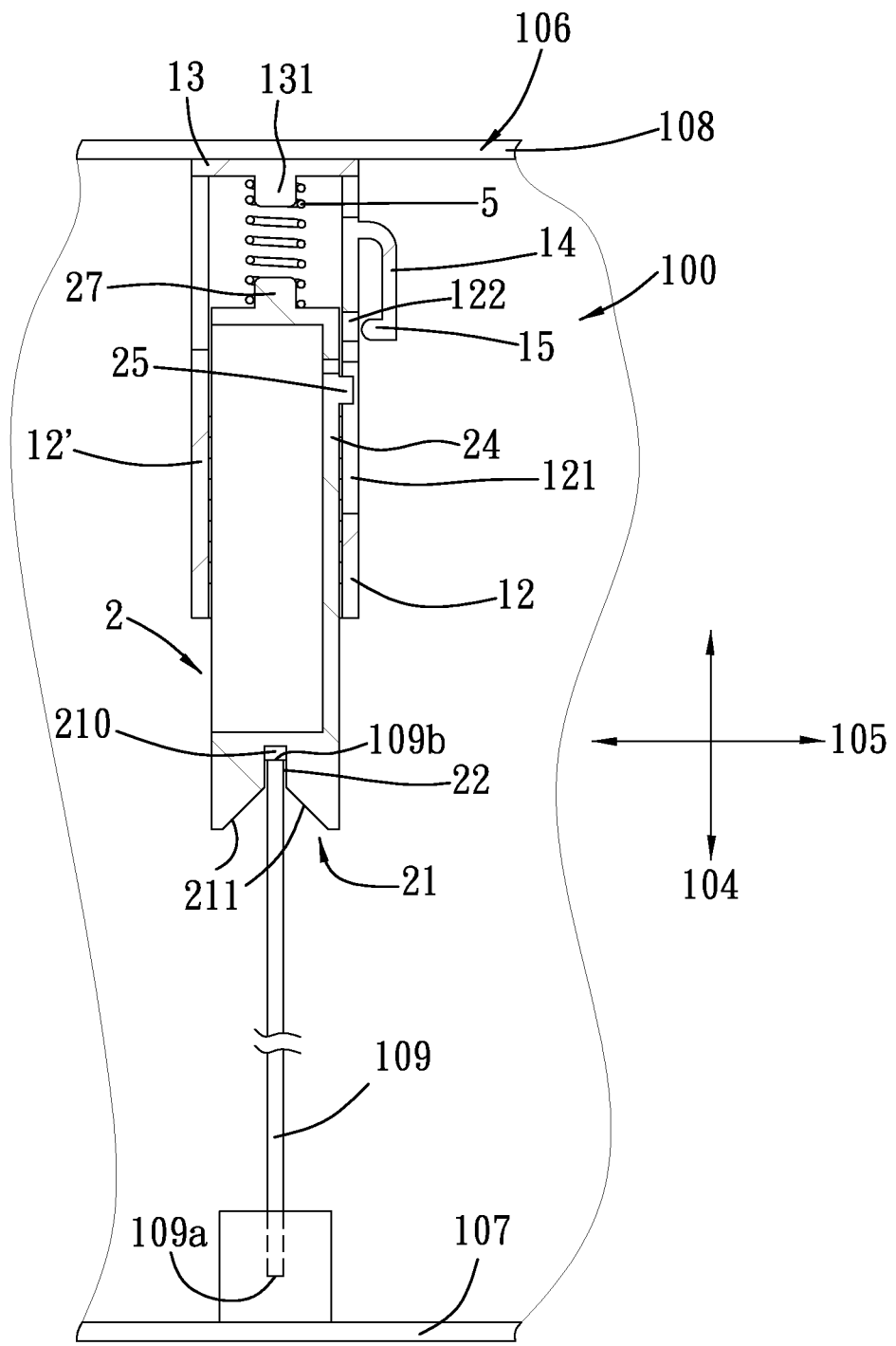
F I G. 7

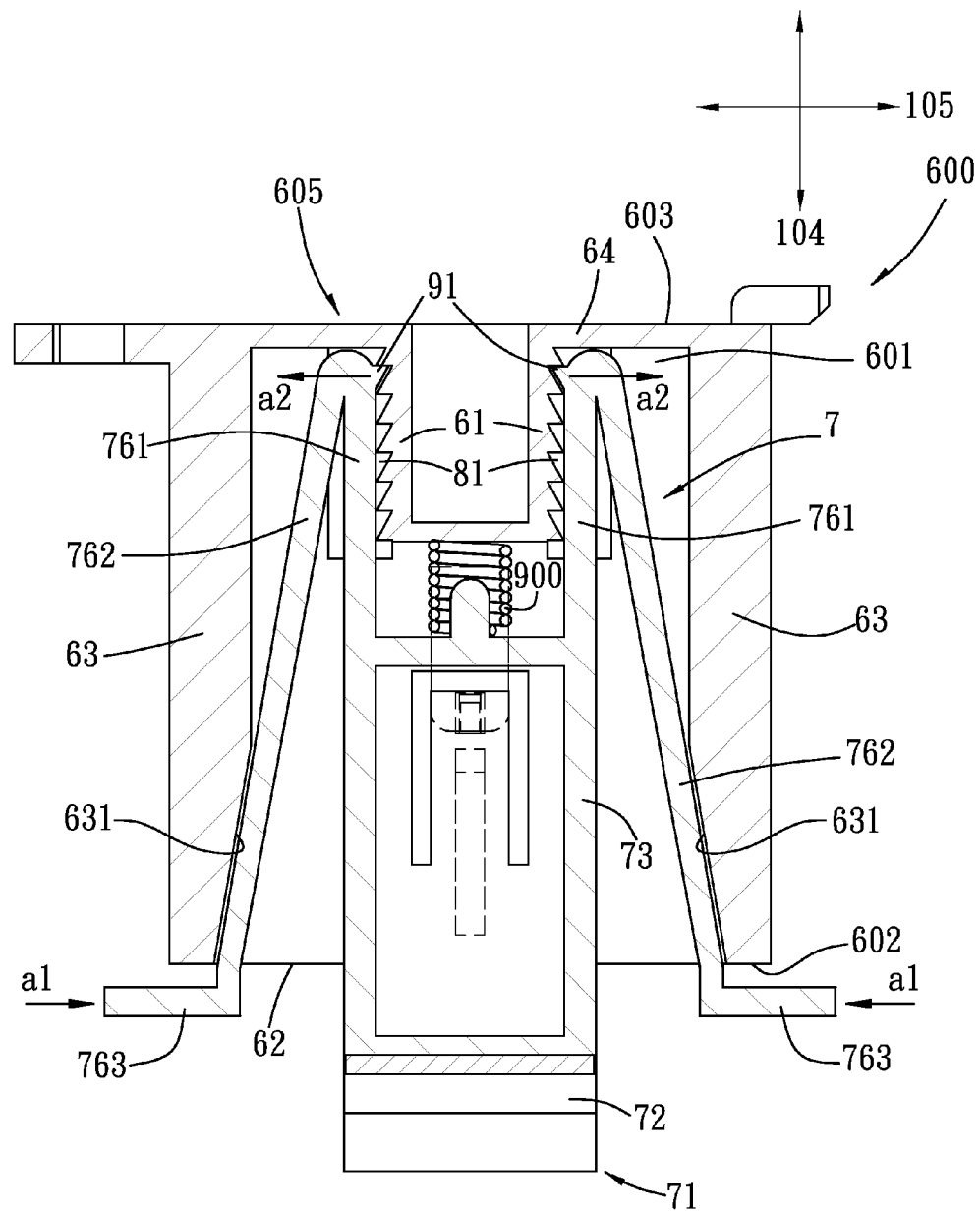
F I G. 10

FIXING DEVICE FOR CIRCUIT BOARD AND ELECTRONIC APPARATUS HAVING THE SAME

CROSS-REFERENCE TO RELATED APPLICATION

This application claims priority of Taiwanese Patent Application No. 100114648, filed on Apr. 27, 2011, the disclosure of which is incorporated herein by reference.

BACKGROUND OF THE INVENTION

1. Field of the Invention

This disclosure relates to a fixing device for a circuit board, and more particularly to a fixing device for assisting fixation of the circuit board in an electronic apparatus and an electronic apparatus having the same.

2. Description of the Related Art

A conventional fixing device for a circuit board is usually configured as an engaging groove provided on a sidewall of a housing for insertion of an end of an expansion card thereinto. Through this, the expansion card can be positioned stably in the housing.

However, because the size of the circuit board of different expansion cards differs and the position of the engaging groove is fixed, if the size of the expansion card to be inserted into the engaging groove differs from that of the engaging groove, the expansion card cannot be positioned in the housing. Hence, use of the conventional fixing device is limited.

SUMMARY OF THE INVENTION

Therefore, an object of the present disclosure is to provide a fixing device for assisting fixation of an end of a circuit board and that is adjustable to fit different sizes of circuit boards.

Another object of the present disclosure is to provide an electronic apparatus having the aforesaid fixing device.

According to one aspect of disclosure of this disclosure, a fixing device for fixing an end of a circuit board comprises a casing, a movable element, a plurality of first positioning portions, and a second positioning portion. The casing defines a receiving space, and has an open end communicating with the receiving space. The movable element has an inner end extending into the receiving space, a protruding end protruding from the open end, and an engaging groove formed in the protruding end for receiving the end of the circuit board. The movable element is movable relative to the casing along a first direction to vary a protruding distance of the protruding end from the open end of the casing. The first positioning portions are provided on one of the casing and the movable element and are arranged along the first direction. The second positioning portion has a structure complementing each of the first positioning portions. The second positioning portion engages interferentially and releasably a selected one of the first positioning portions along a second direction that is perpendicular to the first direction to restrict movement of the movable element relative to the casing.

According to another aspect of disclosure of this disclosure, an electronic apparatus comprises a housing, a circuit board, and the aforesaid fixing device. The housing includes opposite first and second housing walls. The circuit board has a first end positioned in the first housing wall, and a second end facing the second housing wall. The fixing device includes a casing, a movable element, a plurality of first positioning portions, and a second positioning portion. The casing is disposed on the second housing wall, defines a receiving space, and has an open end communicating with the receiving space. The movable element has an inner end extending into the receiving space, a protruding end protruding from the open end, and an engaging groove formed in the protruding end to receive the second end of the circuit board. The movable element is movable relative to the casing along a first direction to vary a protruding distance of the protruding end from the open end of the casing. The first positioning portions are provided on one of the casing and the movable element and are arranged along the first direction. The second positioning portion is provided on the other one of the casing and the movable element. The second positioning portion has a structure complementing each of the first positioning portions. The second positioning portion engages interferentially and releasably a selected one of the first positioning portions along a second direction that is perpendicular to the first direction to restrict movement of the movable element relative to the casing.

According to still another aspect of this disclosure, a fixing device for fixing an end of a circuit board comprises a casing, a movable element, and a spring member. The casing defines a receiving space, and has an open end communicating with the receiving space. The movable element has an inner end extending into the receiving space, a protruding end protruding from the open end, and an engaging groove formed in the protruding end for receiving the end of the circuit board. The movable element is movable relative to the casing along a first direction to vary a protruding distance of the protruding end from the open end of the casing. The spring member abuts against the casing and the movable element along the first direction to bias the movable element to move toward the open end.

According to yet another aspect of this disclosure, an electronic apparatus comprises a housing, a circuit board, and a fixing device. The housing includes opposite first and second housing walls. The circuit board has a first end positioned in the first housing wall, and a second end facing the second housing wall. The fixing device includes a casing, a movable element, and a spring member. The casing defines a receiving space, and has an open end communicating with the receiving space. The movable element has an inner end extending into the receiving space, a protruding end protruding from the open end, and an engaging groove formed in the protruding end to receive the second end of the circuit board. The movable element is movable relative to the casing along a first direction to vary a protruding distance of the protruding end from the open end. The spring member abuts against the casing and the movable element along the first direction to bias the movable element to move toward the open end.

BRIEF DESCRIPTION OF THE DRAWINGS

Other features and advantages of the present disclosure will become apparent in the following detailed description of the embodiments of the disclosure, with reference to the accompanying drawings, in which:

FIG. 6 is an assembled sectional view of the fixing device of the first embodiment taken from another angle;

FIG. 7 is a fragmentary sectional view of the electronic apparatus of the first embodiment, illustrating how an end of a circuit board is insertedly positioned in an engaging groove of a movable element;

FIG. 10 is a sectional view of the fixing device of the second embodiment in an assembled state.

DETAILED DESCRIPTION OF THE PREFERRED EMBODIMENTS

Figure 1:
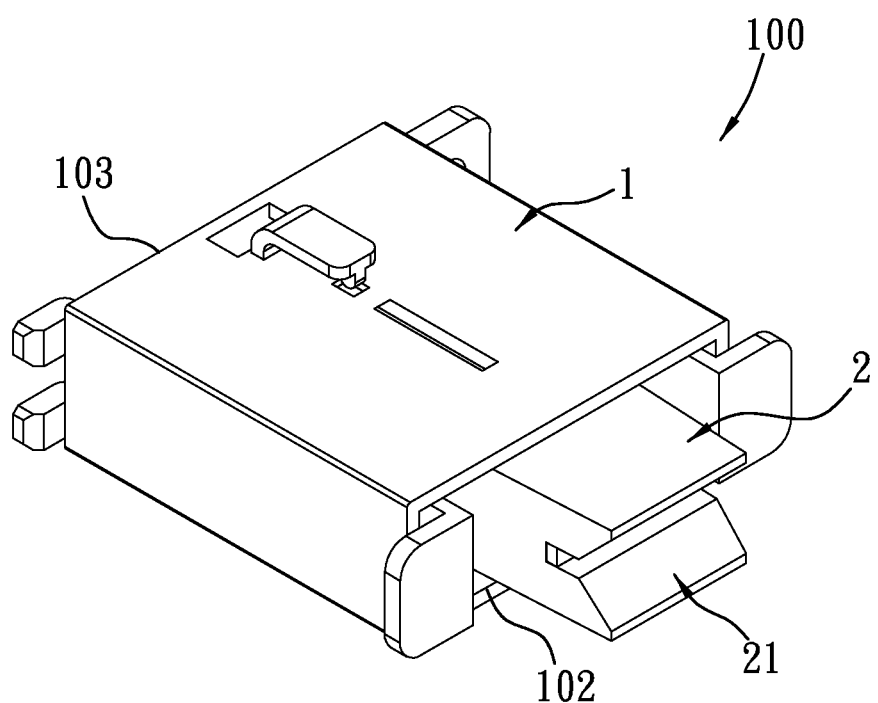
FIG. 1 is a perspective view of a fixing device of an electronic apparatus according to the first embodiment of the present disclosure.

The above-mentioned and other technical contents, features, and effects of this disclosure will be clearly presented from the following detailed description of two embodiments in coordination with the reference drawings.

Referring to FIGS. 1 to 8, an electronic apparatus according to the first embodiment of the present disclosure comprises a housing 106, a circuit board 109 disposed in the housing 106, and a fixing device 100 disposed in the housing 106 for assisting fixation of an end of the circuit board 109 in the housing 106. The electronic apparatus may be a main module or a server of a computer. The housing 106 includes opposite first and second housing walls 107, 108. The circuit board 109 has a first end (109a) insertedly positioned in the first housing wall 107, and a second end (109b) facing the second housing wall 108. The fixing device 100 is disposed on the second housing wall 108 to fix the second end (109b) of the circuit board 109.

Figure 2:
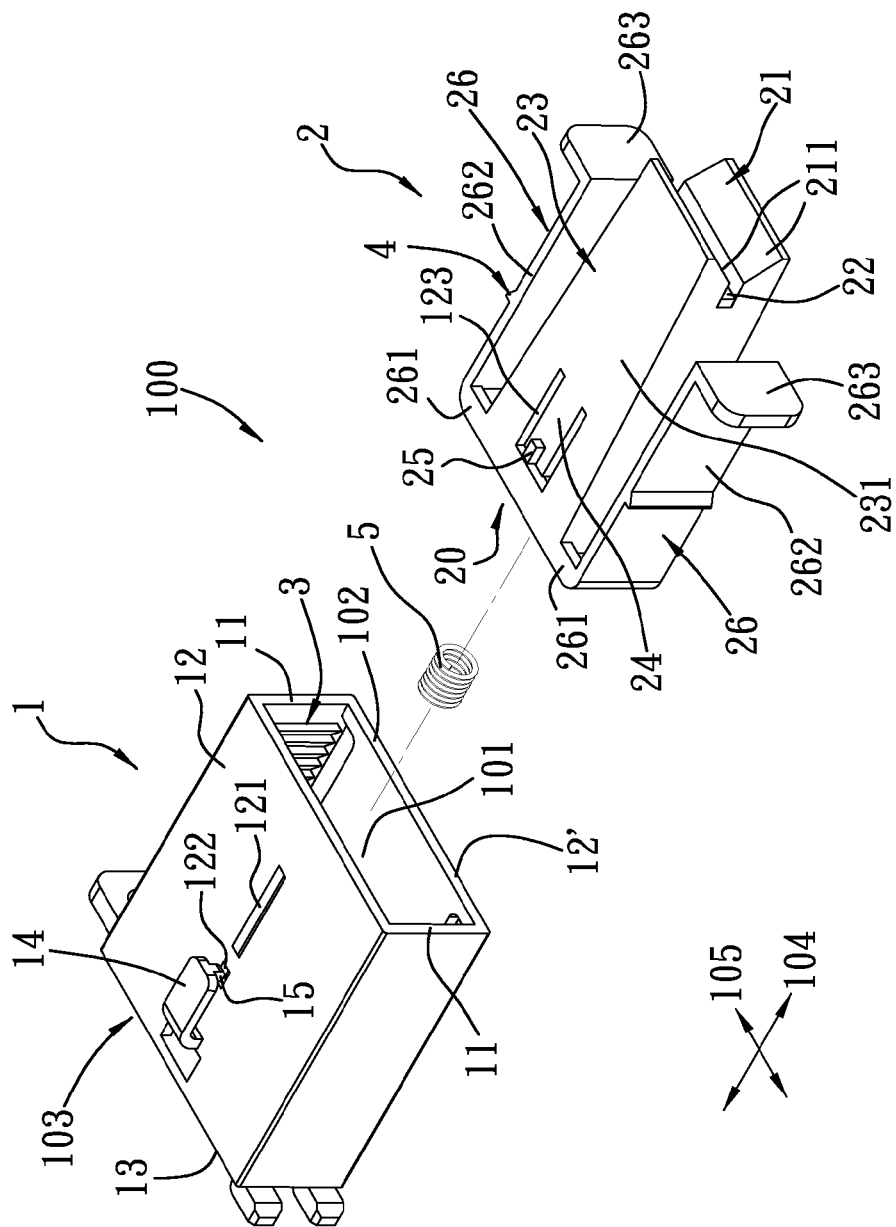
FIG. 2 is an exploded perspective view of the fixing device of the first embodiment.
Figure 3:
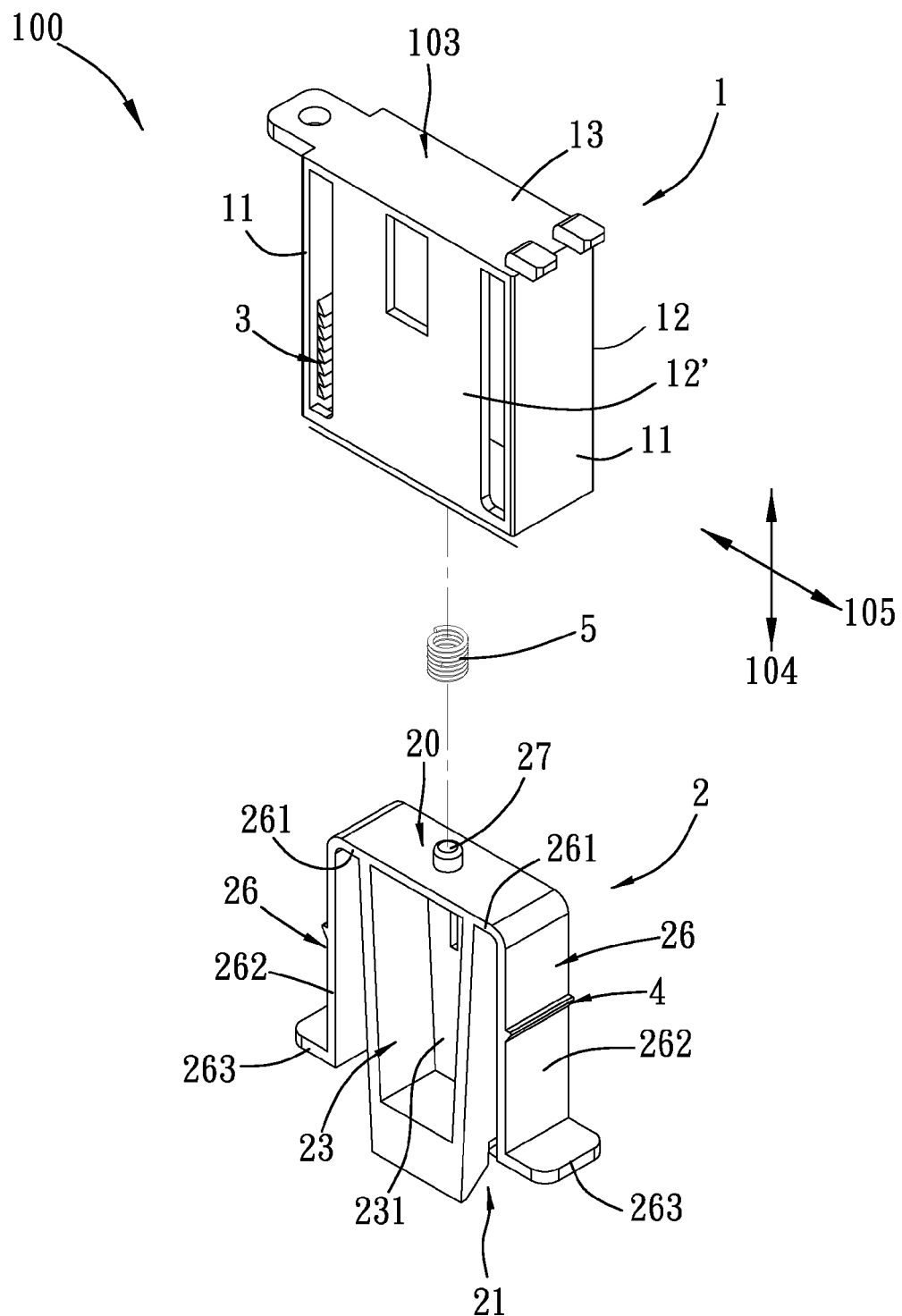
FIG. 3 is an exploded perspective view of the fixing device of the first embodiment taken from another angle.

With reference to FIGS. 1 to 3, the fixing device 100 includes a casing 1, a movable element 2, a plurality of first positioning portions 3, a second positioning portion 4, and a spring member 5.

The casing 1 defines a receiving space 101, and has an open end 102 communicating with the receiving space 101, and a closed end 103 opposite to the open end 102 along a first direction 104. The casing 1 includes two spaced-apart positioning walls 11, two spaced-apart guide walls 12, 12' connected to and disposed between the positioning walls 11, and an end wall 13. The positioning walls 11 and the guide walls 12, 12' cooperatively define the receiving space 101 and the open end 102. The end wall 13 is disposed on the closed end 103 and is connected to the positioning walls 11 and the guide walls 12, 12' to close one end of the receiving space 101. The end wall 13 has a first projection 131 (see FIG. 4) projecting therefrom into the receiving space 101. The guide wall 12 is formed with a limiting through hole 121 that extends along the first direction 104, and an engaging hole 122 between the closed end 103 and the limiting through hole 121.

Figure 5:
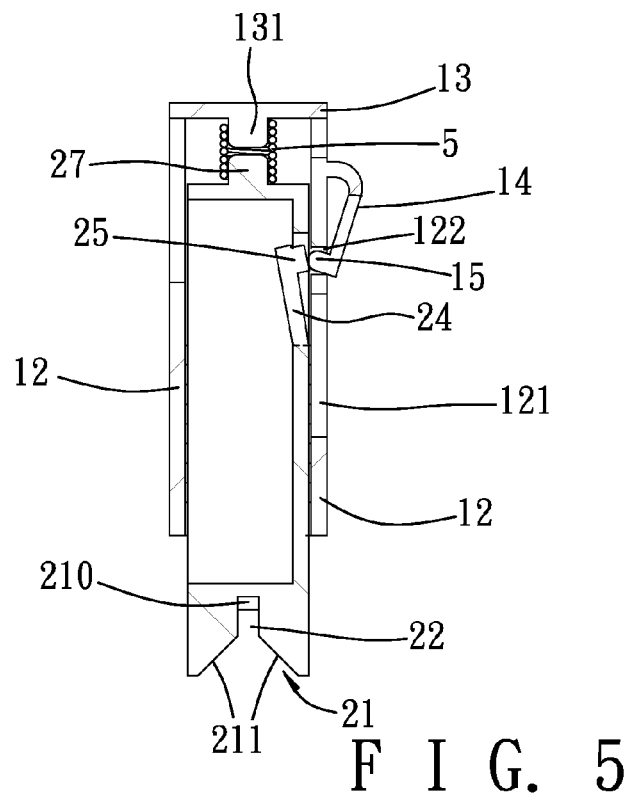
FIG. 5 is a view similar to FIG. 4, but illustrating how a press piece is pressed to push a guide stud out of an engaging hole.

The casing 1 further includes a press piece 14 and a protrusion 15. In this embodiment, the press piece 14 has one end connected to the guide wall 12, and another opposite end spaced apart from the guide wall 12. The protrusion 15 projects from the opposite end of the press piece 14 toward the guide wall 12 at a position corresponding to the engaging hole 122. Hence, as shown in FIG. 5, when the press piece 14 is pressed at a position corresponding to the protrusion 15 toward the guide wall 12, the protrusion 15 can extend into the engaging hole 122.

Figure 8:
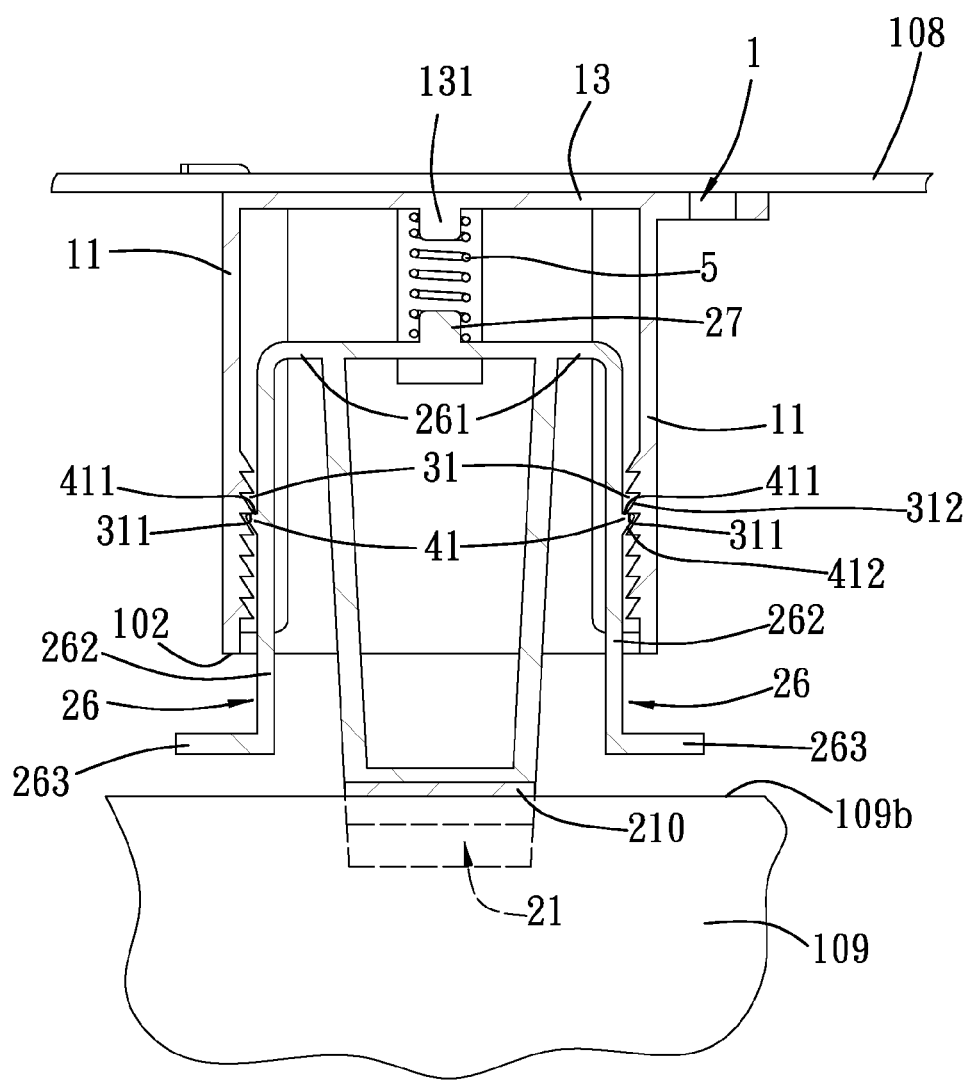
FIG. 8 is another fragmentary sectional view of the first embodiment.

With reference to FIG. 8, the casing 1 is fixed to the second wall 108 of the housing 106 through the end wall 13, so that the open end 102 faces the second end (109b) of the circuit board 109. The fixing method may include using screw or snap fasteners.

With reference to FIGS. 1 to 4, the movable element 2 includes a main body 23, a resilient plate 24 formed on the main body 23, a guide stud 25 formed on the resilient plate 24, and two resilient arms 26 connected to the main body 23. The main body 23 extends into the receiving space 101 through the open end 102, and has an inner end 20 facing the end wall 13, a protruding end 21 opposite to the inner end 20 and protruding from the open end 102, and an engaging groove 22 formed in the protruding end 21 to receive the second end (109b) of the circuit board 109. The movable element 2 is movable relative to the casing 1 along the first direction 104 to vary a protruding distance of the protruding end 21 from the open end 102. In this embodiment, the protruding end 21 has a substantially V-shaped cross section (see FIG. 4), and is formed with two opposite inclined faces 211. The engaging groove 22 is formed between the inclined faces 211. The movable element 2 further includes a second projection 27 projecting from the inner end 20 toward the end wall 13.

The main body 23 of the movable element 2, in this embodiment, is hollow, and further has a main wall 231 facing the guide wall 12. The resilient plate 24 is formed on the main wall 231. Concretely speaking, the resilient plate 24 is defined by a U-shaped slit 123 in the main wall 231 and deforms in the presence of an external force. The guide stud 25 projects from the resilient plate 24 to engage the engaging hole 122. The guide stud 25 displaces along with a resilient deformation of the resilient plate 24.

In this embodiment, the resilient arms 26 are disposed between the positioning walls 11 of the casing 1. Each of the resilient arms 26 includes a first section 261, a second section 262, and a third section 263. The first sections 261 of the resilient arms 26 are respectively connected to two opposite sides of the inner end 20, and extend oppositely along a second direction 105 that is perpendicular to the first direction 104. The second section 262 of each resilient arm 26 interconnects the first and third sections 261, 263 of the respective resilient arm 26, and extends roughly along the first direction 104. The second sections 262 of the resilient arms 26 are spaced apart from the main body 23, but are respectively proximate to the positioning walls 11. The third sections 263 of the resilient arms 26 are disposed outside of the open end 102, and extend oppositely along the second direction 105. With reference to FIG. 6, when the third sections 263 of the resilient arms 26 are pressed toward each other, the second sections 262 of the resilient arms 26 are deformed to move toward each other and away from the respective positioning walls 11 along the second direction 105.

With reference to FIGS. 3 and 6, in this embodiment, the first positioning portions 3 include two rows of notches provided respectively on inner wall faces of the positioning walls 11 and arranged along the first direction 104. Concretely speaking, the inner wall faces of the positioning walls 11 are formed with serrations. Each notch 31 has a first stop face 311 facing the open end 102 of the casing 1 and substantially parallel to the second direction 105, and a first inclined face 312 extending inclinedly from the first stop face 311 to a corresponding one of the positioning walls 11.

The second positioning portion 4 includes two engaging teeth 41 provided respectively on the second sections 262 of the resilient arms 26 and confronting the positioning walls 11. Each of the engaging teeth 41 has a structure complementing each of the notches 31. Each engaging tooth 41 has a second stop face 411 facing opposite the protruding end 21 and parallel to the second direction 105, and a second inclined face 412 extending inclinedly from the second stop face 411 to the second section 262 of a respective one of the resilient arms 26.

The position of the notches 31 and the engaging teeth 41 may be interchanged. That is, the notches 31 may be provided on the movable element 2, and the engaging teeth 41 may be provided on the casing 1.

The spring member 5 has two opposite ends respectively sleeved on the first and second projections 131, 27 and respectively abutting against the closed end 103 of the casing 1 and the inner end 20 of the movable element 2 along the first direction 104. The spring member 5 biases the movable element 2 to move toward the open end 102 of the casing 1 along the first direction 104.

Figure 4:
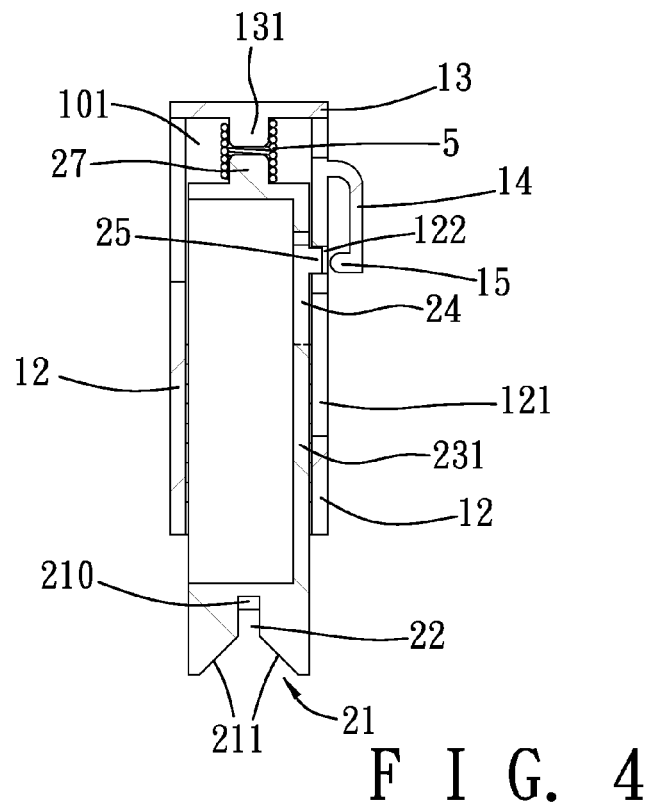
FIG. 4 is a sectional view of the fixing device of the first embodiment in an assembled state.

With reference to FIG. 4, when the guide stud 25 of the movable element 2 engages the engaging hole 122 in the casing 1, the movable element 2 compresses the spring member 5 and is in a state where a protruding distance of the protruding end 21 from the open end 102 is the shortest. With reference to FIGS. 5 and 7, when use of the fixing device 100 is required, by pressing the press piece 14 to extend the protrusion 15 into the engaging hole 122 and push the guide stud 25 out of the engaging hole 122, the resilient plate 24 receives a definite degree of resilient deformation, and the movable element 2 is biased to move toward the open end 102 along the first direction 104 through a returning force of the spring member 5. As the movable element 2 moves to a position where the guide stud 25 corresponds to the limiting through hole 121, through a returning force of the resilient plate 24, the guide stud 25 is biased to move into the limiting through hole 121 and is slidable along the limiting through hole 121.

Next, with reference to FIGS. 6 to 8, a distance between the engaging groove 22 of the protruding end 21 and the second end (109b) of the circuit board 109 is adjusted accordingly by pressing the third sections 263 of the resilient arms 26 toward each other along the second direction 105 so as to move the two engaging teeth 41 away from the respective positioning walls 11. Subsequently, through the biasing force of the spring member 5 that biases the movable element 2 toward the open end 102, a protruding distance of the protruding end 21 from the open end 102 can be adjusted, after which each engaging teeth 41 is engaged to a selected one of the notches 31 in the respective positioning wall 11. As a result, the second end (109b) of the circuit board 109 can be engaged to the engaging groove 22 in the protruding end 21 of the movable element 2, and can cooperate with the first end (109a) to position and support the circuit board 109 in the housing 106 of the electronic apparatus.

It should be noted that, with reference to FIG. 8, when each engaging tooth 41 is engaged to a selected one of the notches 31 in the respective positioning wall 11, the second stop face 411 of each engaging tooth 41 abuts against the first stop face 311 of the selected notch 31, thereby restricting movement of the movable element 2 toward the closed end 103 of the casing 1. That is, the movable element 2 is prevented from retracting easily into the casing 1 to thereby lose the effect of assisting and supporting the second end (109b) of the circuit board 109. Further, because the second inclined faces 412 of the engaging teeth 41 are stopped by the first inclined faces 312 of the selected notches 31 when the movable element 2 moves toward the open end 102, the movable element 2 can be prevented from directly moving out of the casing 1 through the biasing force of the spring member 5 such that the protruding end 21 thereof is disposed at a distance farthest from the open end 102. Alternatively, in the absence of the spring member 5 and the structural cooperation between the guide stud 25 and the limiting through hole 121, the first inclined face 312 of each notch 31 also has a definite degree of stopping effect relative to the engaging tooth 41 of the second positioning portion 4, so that movement of the movable element 2 toward the open end 102 due to its own weight can be restricted.

This embodiment further comprises an elastic cushion 210 disposed in the engaging groove 22 of the protruding end 21 of the movable element 2. Through the elasticity of the elastic cushion 210, the amount of error formed between the spacing of the notches 31 can be compensated, and the second end (109b) of the circuit board 109 can engage the engaging groove 22 by squeezing the elastic cushion 210, thereby increasing abutment stability of the second end (109b) of the circuit board 109.

The cooperation between the first and second positioning portions 3, 4 is not limited to the aforesaid structure. For example, the cooperation between the first and second positioning portions 3, 4 may be in the form of a semi-circular protrusion and a plurality of semi-circular indentations. Through a slidable movement of the movable element 2 relative to the casing 1, the semi-circular protrusion can engage selectively one of the semi-circular indentations to restrict movement of the movable element 2 relative to the casing 1. Hence, even if the casing 1 and the movable element 2 only have the cooperation between the first and second positioning portions 3, 4, the effect of assisting and supporting the circuit board 109 can be similarly achieved.

From the aforesaid description, through the slidable configuration of the movable element 2 relative to the casing 1, the effect of assisting and supporting different sizes of the circuit board 109 by the fixing device 100 can be achieved, thereby increasing the flexibility of use of the fixing device 100 of this disclosure. Through the cooperation between the first and second positioning portions 3, 4, a protruding distance of the protruding end 21 of the movable element 2 from the open end 102 of the casing 1 can be restricted, so that the engagement and abutment stability of the second end (109b) of the circuit board 109 with the movable element 2 can be retained. The provision of the resilient arms 26 facilitates disengagement of the structural interference between the first and second positioning portions 3, 4. The spring member 5 provides a biasing force to move the movable element 2 toward the open end 102 so as to enhance engagement and abutment stability of the second end (109b) of the circuit board 109 with the engaging groove 22. Moreover, through cooperation between the limiting through hole 121 and the guide stud 25, the movement of the movable element 2 relative to the casing 1 can be guided effectively.

In an alternative form of the first embodiment, the first and second positioning portions 3, 4 may be omitted. Through the biasing force of the spring member 5, in cooperation with the slidable movement of the guide stud 25 along the limiting through hole 121, a stepless adjustment of the movable element 2 relative to the casing 1 can be provided so that the movable element 2 can cooperate with different sizes of circuit boards. Alternatively, other guiding mechanisms may be provided between the casing 1 and the movable element 2, and other stop mechanisms may be provided to prevent the movable element 2 from being biased out of the casing 1 by the biasing force of the spring member 5.

Figure 9:
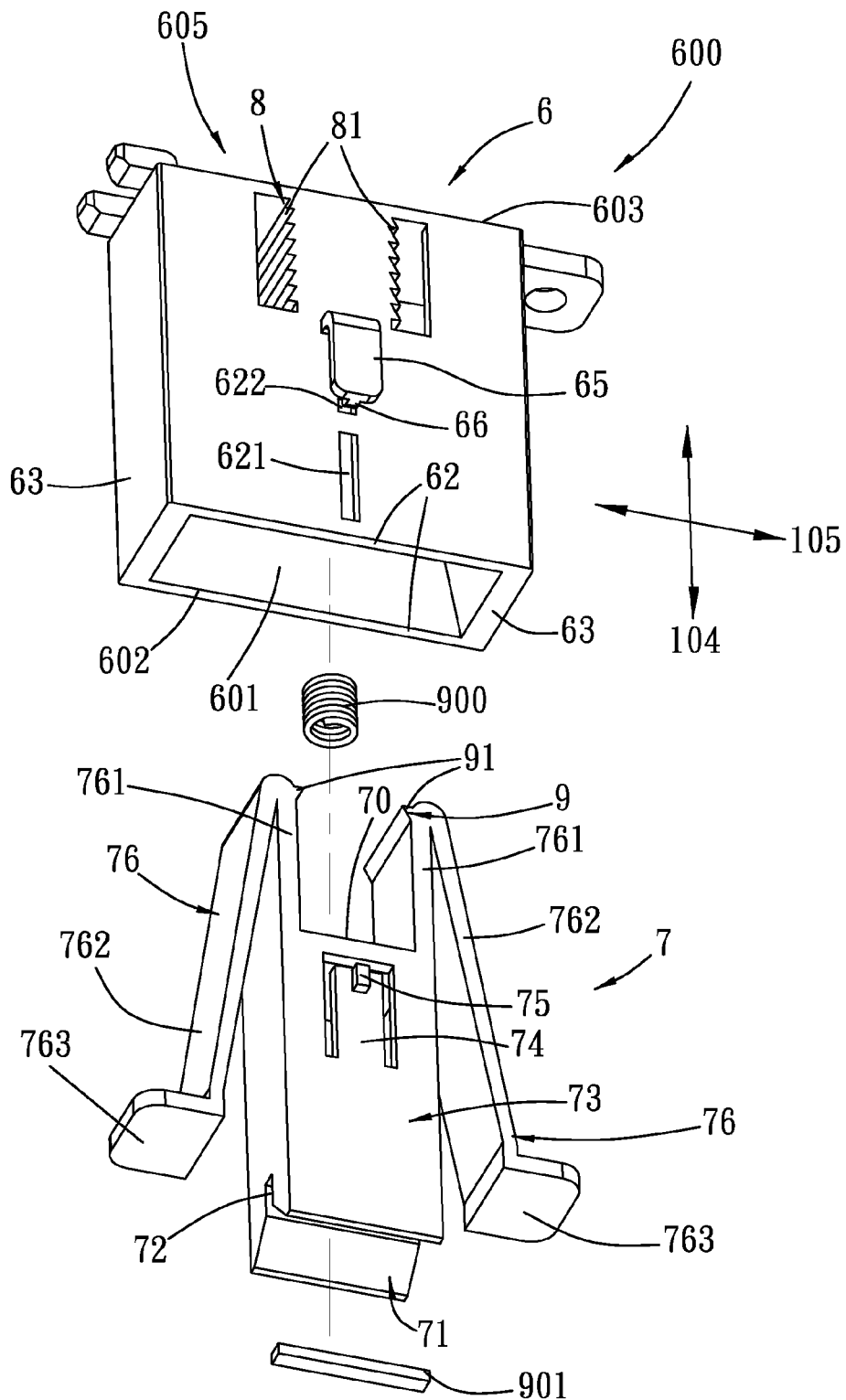
FIG. 9 is an exploded perspective view of a fixing device of an electronic apparatus according to the second embodiment of the present disclosure.

Referring to FIGS. 9 and 10, an electronic apparatus according to the second embodiment of the present disclosure is shown to be similar to the first embodiment. The difference resides in the construction of the fixing device 600.

In this embodiment, the fixing device 600 includes a casing 6, a movable element 7, a plurality of first positioning portions 8, a second positioning portion 9, and a spring member 900. The casing 6 further includes two spaced-apart abutment walls 63 extending along the first direction 104. The positioning walls 61 are disposed between the abutment walls 63. The guide walls 62 interconnect the abutment walls 63 and the positioning walls 63, and cooperate with the abutment walls 63 to define the receiving space 601 and the open end 602. Each of the abutment walls 63 has an inclined face 631 that is proximate to the open end 602 and that extends outwardly and inclinedly from an inner face of a respective abutment wall 63 toward the open end 602. The first positioning portions 8 include two rows of notches 81 provided on surfaces of the positioning walls 61 that confront the abutment walls 63. The structure of the notches 81 is similar to that of the notches 31 described in the first embodiment.

Further, the casing 6 is provided with a press piece 65, a protrusion 66, a limiting through hole 621, and an engaging hole 622 substantially similar to those described in the first embodiment.

The movable element 7 includes a main body 73, a resilient plate 74 formed on the main body 73, a guide stud 75 formed on the resilient plate 74, and two resilient arms 76 connected to the main body 73. The main body 73 has an inner end 70, a protruding end 71 opposite to the inner end 70 and protruding from the open end 602, and an engaging groove 72 formed in the protruding end 71. The structure of each of the protruding end 71, the engaging groove 72, the main body 73, the resilient plate 74, and the guide stud 75 is substantially similar to that described in the first embodiment.

Each of the resilient arms 76 includes a first section 761, a second section 762, and a third section 763. The first section 761 is connected to and extends from one of the two opposite sides of the inner end 70 toward the closed end 605 of the casing 6 along the first direction 104. The second section 762 has one end connected to and cooperating with the first section 761 to define a V-shaped structure, and another end that extends inclinedly from said one end of the second section 762 gradually away from the main body 73 toward the open end 602 and that is connected to the third section 763. The third sections 763 of the resilient arms 76 extend oppositely from each other along the second direction 105, and are disposed outside of the open end 602. The inclined faces 631 of the abutment walls 63 have structures matching that of the second sections 762 of the resilient arms 76 for abutment thereagainst of the second sections 762. The engaging teeth 91 of the second positioning portion 9 are respectively formed on surfaces of the first sections 761 of the resilient arms 76 that confront each other. Particularly, each engaging tooth 91 is disposed in proximity to a junction between the first section 761 and a respective second section 762.

The spring member 900 extends along the first direction 104, and is similarly provided between the closed end 603 of the casing 6 and the inner end 70 of the movable element 7 so as to bias the movable element 7 to move toward the open end 602.

When the movable element 7 extends into the receiving space 601, the positioning walls 61 are disposed between the first sections 761 of the resilient arms 76, and each engaging tooth 91 is engaged to a selected one of the notches 81 in the respective positioning wall 61. The operating method of the fixing device 600 is substantially similar to that described in the first embodiment, so that a detailed description of the same is dispensed herewith. It should be noted that, in this embodiment, because the structure of the resilient arms 76 is different from that described in the first embodiment, when the third sections 763 of the resilient arms 76 are pressed toward each other in the direction of arrows (a1), as shown in FIG. 10, the second sections 762 of the resilient arms 76 respectively pull the first sections 761 away from the respective positioning walls 761 in the direction of arrows (a2) to disengage the engaging teeth 91 from the respective notches 81.

Similarly, in an alternative form of the second embodiment, the first and second positioning portions 8, 9 may be omitted. Through coordination of the spring member 900 with the limiting through hole 621 and the guide stud 75, a stepless adjustment of the movable element 7 relative to the casing 6 may also be achieved.

Hence, the second embodiment is substantially similar to the first embodiment. The difference between the first and second embodiments resides in the structure of the resilient arms 76, the position of the first positioning portions 8, and the structure of the positioning walls 61 and the corresponding second positioning portion 9.

In summary, through the structural configuration of the movable element 2, 7 being movable relative to the casing 1, 6, and in cooperation with the mechanism of the first and second positioning portions 3, 8, 4, 9 and/or the spring member 5, 900, the movable element 2, 7 can be flexibly adjusted so that the protruding end 21, 71 thereof can be disposed outside of the open end 102, 602 of the casing 1, 6 at a distance to fit different sizes of circuit boards. Indeed, the flexibility of use of the present disclosure can be enhanced, and the object of the present disclosure can be realized.

While the present disclosure has been described in connection with what are considered the most practical embodiments, it is understood that this disclosure is not limited to the disclosed embodiments but is intended to cover various arrangements included within the spirit and scope of the broadest interpretations and equivalent arrangements.

What is claimed is:

1. A fixing device for fixing an end of a circuit board, said fixing device comprising:

a casing defining a receiving space and having an open end communicating with said receiving space;

a movable element extending into said receiving space and having an inner end, a protruding end protruding from said open end, and an engaging groove formed in said protruding end for receiving the end of the circuit board, said movable element being movable relative to said casing along a first direction to vary a protruding distance of said protruding end from said open end of said casing;

a plurality of first positioning portions provided on one of said casing and said movable element and arranged along said first direction; and a second positioning portion provided on the other one of said casing and said movable element;

said second positioning portion having a structure complementing each of said first positioning portions, said second positioning portion engaging interferentially and releasably a selected one of said first positioning portions along a second direction that is perpendicular to said first direction to restrict movement of said movable element relative to said casing;

wherein said casing includes two spaced-apart positioning walls extending along said first direction, said movable element including two resilient arms respectively proximate to said positioning walls, said resilient arms being movable toward each other and away from said respective positioning walls along said second direction, said first positioning portions including two rows of notches provided respectively on said positioning walls, said second positioning portion including two engaging teeth provided respectively on said resilient arms.

2. The fixing device as claimed in claim 1, wherein said movable element further includes a main body having said inner end and said protruding end, said resilient arms being connected respectively to two opposite sides of said main body, said casing further having a closed end opposite to said open end, said fixing device further comprising a spring member abutting against said inner end of said main body and said closed end of said casing along said first direction.

3. The fixing device as claimed in claim 2, wherein said resilient arms are disposed between said positioning walls, each of said resilient arms having a first section, a second section, and a third section, said first section being connected to one of said two opposite sides of said main body, said second section interconnecting said first and third sections and being spaced apart from said main body, said third section being disposed outside of said open end.

4. The fixing device as claimed in claim 3, wherein said casing further includes two spaced-apart guide walls connected to and disposed between said positioning walls, said positioning walls and said guide walls cooperatively defining said receiving space and said open end, one 10 of said guide walls being formed with a limiting through hole extending along said first direction, said movable element further having a guide stud projecting from said main body and extendable into said limiting through hole.

5. The fixing device as claimed in claim 2, wherein said casing further includes two spaced-apart abutment walls, said positioning walls being disposed between said abutment walls, each of said resilient arms including a first section connected to and extending from one of said two opposite sides of said main body toward said closed end of said casing, a second section extending inclinedly from said first section toward said open end of said casing, and a third section connected to said second section and disposed outside of said open end.

6. The fixing device as claimed in claim 5, wherein said positioning walls are disposed between said first sections of said resilient arms, said engaging teeth being provided respectively on said first sections of said resilient arms.

7. The fixing device as claimed in claim 6, wherein said casing further includes two spaced-apart guide walls interconnecting said abutment walls and said positioning walls, said abutment walls and said guide walls cooperatively defining said receiving space and said open end, one of said guide walls being formed with a limiting through hole extending along said first direction, said movable element further having a guide stud projecting from said main body and extendable into said limiting through hole.

8. The fixing device as claimed in claim 4, wherein said casing further includes a press piece and a protrusion, said press piece having one end connected to said one of said guide walls, and another opposite end spaced apart from said one of said guide walls, said protrusion projecting from said opposite end of said press piece toward said one of said guide walls, said one of said guide walls being further formed with an engaging hole that corresponds in position to said protrusion and that is disposed between said closed end of said casing and said limiting through hole, said movable element further including a resilient plate formed on said main body, said guide stud being formed on said resilient plate to engage said engaging hole, said main body compressing said spring member when said guide stud engages said engaging hole.

9. The fixing device as claimed in claim 1, wherein each of said notches includes a first stop face facing said open end and substantially parallel to said second direction, and a first inclined face extending inclinedly from said first stop face to a corresponding one of said positioning walls, each of said engaging teeth having a second stop face substantially parallel to said second direction, and a second inclined face extending inclinedly from said second stop face to said second section of a respective one of said resilient arms, said second stop face abutting against said first stop face of one of said notches to restrict movement of said movable element toward said closed end of said casing.

10. The fixing device as claimed in claim 1, herein said protruding end has a substantially V-shaped cross section, and is formed with two opposite inclined faces, said engaging groove being formed between said inclined faces.

11. The fixing device as claimed in claim 1, wherein said movable element further includes an elastic cushion disposed in said engaging groove.

12. An electronic apparatus, comprising:
a housing including opposite first and second housing walls;
a circuit board having a first end positioned in said first housing wall, and a second end facing said second housing wall; and
a fixing device including
a casing disposed on said second housing wall, said casing defining a receiving space and having an open end communicating with said receiving space,
a movable element extending into said receiving space and having an inner end, a protruding end protruding from said open end, and an engaging groove formed in said protruding end to receive said second end of said circuit board, said movable element being movable relative to said casing along a first direction to vary a protruding distance of said protruding end from said open end of said casing,
a plurality of first positioning portions provided on one of said casing and said movable element and arranged along said first direction, and
a second positioning portion provided on the other one of said casing and said movable element,
said second positioning portion having a structure complementing each of said first positioning portions, said second positioning portion engaging interferentially and releasably a selected one of said first positioning portions along a second direction that is perpendicular to said first direction to restrict movement of said movable element relative to said casing;
wherein said casing includes two spaced-apart positioning walls extending along said first direction, said movable element including two resilient arms respectively proximate to said positioning walls, said resilient arms being movable toward each other and away from said respective positioning walls along said second direction, said first positioning portions including two rows of notches provided respectively on said positioning walls, said second positioning portion including two engaging teeth provided respectively on said resilient arms.

13. The electronic apparatus as claimed in claim 12, wherein said movable element further includes a main body having said inner end and said protruding end, said resilient arms being connected respectively to two opposite sides of said main body, said casing further having a closed end opposite to said open end, said fixing device further comprising a spring member abutting against said inner end of said movable element and said closed end of said casing along said first direction.

14. The electronic apparatus as claimed in claim 13, wherein said resilient arms are disposed between said positioning walls, each of said resilient arms having a first section, a second section, and a third section, said first section being connected to one of said two opposite sides of said main body, said second section interconnecting said first and third sections and being spaced apart from said main body, said third section being disposed outside of said open end.

15. The electronic apparatus as claimed in claim 14, wherein said casing further includes two spaced-apart guide walls connected to and disposed between said positioning walls, said positioning walls and said guide walls cooperatively defining said receiving space and said open end, one of said guide walls being formed with a limiting through hole extending along said first direction, said movable element further having a guide stud projecting from said main body and extendable into said limiting through hole.

16. The electronic apparatus as claimed in claim 13, wherein said casing further includes two spaced-apart abutment walls, said positioning walls being disposed between said abutment walls, each of said resilient arms including a first section connected to and extending from one of said two opposite sides of said main body toward said closed end of said casing, a second section extending inclinedly from said first section toward said open end of said casing, and a third section connected to said second section and disposed outside of said open end.

17. The electronic apparatus as claimed in claim 16, wherein said positioning walls are disposed between said first sections of said resilient arms, said engaging teeth being provided respectively on said first sections of said resilient arms.

18. The electronic apparatus as claimed in claim 17, wherein said casing further includes two spaced-apart guide walls interconnecting said abutment walls and said positioning walls, said abutment walls and said guide walls cooperatively defining said receiving space and said open end, said casing further including a limiting through hole formed in one of said guide walls and extending along said first direction, said movable element further having a guide stud projecting from said main body and extendable into said limiting through hole.

19. The electronic apparatus as claimed in claim 15, wherein said casing further includes a press piece and a protrusion, said press piece having one end connected to said one of said guide walls, and another opposite end spaced apart from an outer face of said one of said guide walls, said protrusion projecting from said another opposite end of said press piece toward said one of said guide walls, said one of said guide walls being further formed with an engaging hole corresponding in position to said protrusion, said engaging hole being disposed between said closed end of said casing and said limiting through hole, said movable element further including a resilient plate formed on said main body, said guide stud being formed on said resilient plate to engage said engaging hole, and wherein, when said guide stud engages said engaging hole, said main body compresses said spring member and said protruding end is proximate to said open end.

20. The electronic apparatus as claimed in claim 12, wherein each of said notches has a first stop face facing said open end and substantially parallel to said second direction, and a first inclined face extending inclinedly from said first stop face to a corresponding one of said positioning walls, each of said engaging teeth having a second stop face substantially parallel to said second direction, and a second inclined face extending inclinedly from said second stop face to said second section of a respective one of said resilient arms, said second stop face abutting against said first stop face of one of said notches to restrict movement of said movable element toward said closed end of said casing.

21. The electronic apparatus as claimed in claim 12, wherein said protruding end has a substantially V-shaped cross section, and is formed with two opposite inclined faces, said engaging groove being formed between said inclined faces.

22. The electronic apparatus as claimed in claim 12, wherein said movable element further includes an elastic cushion disposed in said engaging groove.

23. A fixing device for fixing an end of a circuit board, said fixing device comprising:
   a casing defining a receiving space and having an open end communicating with said receiving space;
   a movable element extending into said receiving space and having an inner end, a protruding end protruding from said open end, and an engaging groove formed in said protruding end for receiving the end of the circuit board, said movable element being movable relative to said casing along a first direction to vary a protruding distance of said protruding end from said open end of said casing; and
   a spring member abutting against said casing and said movable element along said first direction to bias said movable element to move toward said open end;
   wherein said casing includes two spaced-apart positioning walls, and two spaced-apart guide walls connected to and cooperating with said positioning walls to define said receiving space and said open end, said movable element including a main body having said inner end and said protruding end, one of said guide walls being formed with a limiting through hole extending along said first direction, said movable element further having a guide stud projecting from said main body and extendable into said limiting through hole.

24. The fixing device as claimed in claim 23, wherein said casing further includes a press piece and a protrusion, said press piece having one end connected to said one of said guide walls, and another opposite end spaced apart from an outer face of said one of said guide walls, said protrusion projecting from said another opposite end of said press piece toward said one of said guide walls, said one of said guide walls being further formed with an engaging hole corresponding in position to said protrusion, said engaging hole being disposed between said closed end of said casing and said limiting through hole, said movable element further including a resilient plate formed on said main body, said guide stud being formed on said resilient plate to engage said engaging hole, and wherein, when said guide stud engages said engaging hole, said main body compresses said spring member and said protruding end is proximate to said open end.

25. An electronic apparatus, comprising:
   a housing including opposite first and second housing walls;
   a circuit board having a first end positioned in said first housing wall, and a second end facing said second housing wall; and
   a fixing device including
      a casing defining a receiving space and having an open end communicating with said receiving space,
      a movable element extending into said receiving space and having an inner end, a protruding end protruding from said open end, and an engaging groove formed in said protruding end to receive said second end of said circuit board, said movable element being movable relative to said casing along a first direction to vary a protruding distance of said protruding end from said open end, and a spring member abutting against said casing and said movable element along said first direction to bias said movable element to move toward said open end;

wherein said casing includes two spaced-apart positioning walls, and two spaced-apart guide walls connected to and cooperating with said positioning walls to define said receiving space and said open end, said movable element including a main body having said inner end and said protruding end, one of said guide walls being formed with a limiting through hole extending along said first direction, said movable element further having a guide stud projecting from said main body and extendable into said limiting through hole.

26. The electronic apparatus as claimed in claim 25, wherein said casing further includes a press piece and a protrusion, said press piece having one end connected to said one of said guide walls, and another opposite end spaced apart from an outer face of said one of said guide walls, said protrusion projecting from said another opposite end of said press piece toward said one of said guide walls, said one of said guide walls being further formed with an engaging hole corresponding in position to said protrusion, said engaging hole being disposed between said closed end of said casing and said limiting through hole, said movable element further including a resilient plate formed on said main body, said guide stud being formed on said resilient plate to engage said engaging hole, and wherein, when said guide stud engages said engaging hole, said main body compresses said spring member and said protruding end is proximate to said open end.

* * * * *